(12) United States Patent
Tanida et al.

(10) Patent No.: US 8,378,379 B2
(45) Date of Patent: Feb. 19, 2013

(54) SUBSTRATE FOR MOUNTING LIGHT-EMITTING ELEMENT AND LIGHT-EMITTING DEVICE

(75) Inventors: Masamichi Tanida, Tokyo (JP); Kenji Imakita, Tokyo (JP); Kazuo Watanabe, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 42 days.

(21) Appl. No.: 12/971,735

(22) Filed: Dec. 17, 2010

(65) Prior Publication Data

US 2011/0204398 A1 Aug. 25, 2011

(30) Foreign Application Priority Data

Feb. 19, 2010 (JP) .................................. 2010-034976
Nov. 17, 2010 (JP) .................................. 2010-257121

(51) Int. Cl.
*H01L 33/00* (2010.01)

(52) U.S. Cl. ............. 257/99; 257/E25.03; 257/E25.031; 257/E25.032

(58) Field of Classification Search ............ 257/98–100, 257/678, 680, E25.03, E25.031, E25.032
See application file for complete search history.

(56) References Cited

U.S. PATENT DOCUMENTS

| | | | |
|---|---|---|---|
| 5,007,948 A | 4/1991 | Araujo | |
| 6,552,368 B2 * | 4/2003 | Tamai et al. | 257/98 |
| 6,680,568 B2 * | 1/2004 | Fujiwara et al. | 313/501 |
| 2007/0057364 A1 | 3/2007 | Wang et al. | |
| 2009/0315057 A1 | 12/2009 | Konishi et al. | |

FOREIGN PATENT DOCUMENTS

| | | |
|---|---|---|
| DE | 38 03 420 A1 | 8/1989 |
| JP | 2007-67116 | 3/2007 |
| JP | 2007-129191 | 5/2007 |
| JP | 2009-231440 | 10/2009 |
| JP | 2010-34487 | 2/2010 |

OTHER PUBLICATIONS

U.S. Appl. No. 13/190,156, filed Jul. 25, 2011, Ohta.
U.S. Appl. No. 13/075,571, filed Mar. 30, 2011, Tanida, et al.
Extended European Search Report issued Aug. 22, 2011, in European Patent Application No. 10015898.9.
Sandra Hornschuh, et al., "Silver ion exchange in glasses of the system $Na_2O/Al_2O_3/B_2O_3/SiO_2$,", Journal of Non-Crystalline Solids, vol. 347, No. 1-3, XP-004640721, Nov. 1, 2004, pp. 121-127.

* cited by examiner

*Primary Examiner* — Brook Kebede
(74) *Attorney, Agent, or Firm* — Oblon, Spivak, McClelland, Maier & Neustadt, L.L.P.

(57) ABSTRACT

A substrate for mounting a light-emitting element, containing a substrate main body having a mounting surface on which a light-emitting element is to be mounted, a reflection layer formed on a part of the mounting surface of the substrate main body and containing silver to reflect light emitted from the light-emitting element, and a vitreous insulating layer formed on the reflection layer, wherein the vitreous insulating layer contains a glass containing $SiO_2$, at least one of $Al_2O_3$ and $B_2O_3$, and at least one member selected from $Li_2O$, $Na_2O$ and $K_2O$, wherein $(Li_2O+Na_2O+K_2O)-Al_2O_3$ is from $-20$ to $1.5\%$ and $SiO_2+3\times Al_2O_3$ is at most 90% calculated using the mol % of each of said $SiO_2$, $Al_2O_3$ $B_2O_3$, $Li_2O$, $Na_2O$ and $K_2O$ in said glass.

8 Claims, 1 Drawing Sheet

SUBSTRATE FOR MOUNTING LIGHT-EMITTING ELEMENT AND LIGHT-EMITTING DEVICE

TECHNICAL FIELD

The present invention relates to a substrate for mounting a light-emitting element and a light-emitting device, particularly to a substrate for mounting a light-emitting element capable of preventing deterioration of the reflectance, and a light-emitting device employing it.

BACKGROUND ART

In recent years, along with a tendency to high brightness and whitening of a light-emitting element such as a light-emitting diode (LED) element, a light-emitting device employing a light-emitting element has been used for illumination, backlights of various displays or large-sized liquid crystal TVs, etc. The substrate for mounting a light-emitting element, to mount a light-emitting element, is usually required to have a high reflectivity to efficiently reflect light emitted from the element.

Accordingly, it has been heretofore attempted to provide a reflection layer on the substrate surface for the purpose of reflecting light emitted from a light-emitting element to a forward direction as far as possible. As such a reflection layer, a reflection layer containing silver (hereinafter sometimes referred to as a silver reflection layer) having a high reflectance is employed.

However, silver is likely to be corroded, and if it is left to stand, a compound such as $Ag_2S$ is likely to be formed, whereby the optical reflectance tends to deteriorate. To prevent such a problem, a method has been proposed wherein the surface of silver is coated with a resin such as a silicon resin, an acrylic resin, an epoxy resin or an urethane resin (Patent Document 1). However, by such a method, moisture or a corrosive gas is likely to enter into the resin or from the interface between the silver reflection layer and the resin, whereby the silver reflection layer is corroded as the time passes, and thus it has been difficult to employ such a method for products which are required to have a reliability for a long period of time.

Accordingly, in order to prevent corrosion of a silver reflection layer, a method has been proposed to coat the surface of silver with a glass layer (Patent Document 2). However, the glass layer formed by this method undergoes a color change from yellow to brown by a reaction with silver during the firing, whereby the reflectance tends to deteriorate, and thus, such a method has been inadequate for application to products.

On the other hand, as a method to increase the reflectance without using a silver reflection layer, it has been proposed to use an alumina material or the like having a high reflectance, but firing at a high temperature exceeding 1,000° C. is required, and thus there has been a problem that the load on the production process is substantial.

PRIOR ART DOCUMENTS

Patent Documents

Patent Document 1: JP-A-2007-067116
Patent Document 2: JP-A-2009-231440

DISCLOSURE OF THE INVENTION

Objects to be Accomplished by the Invention

The present invention has been made to solve the above problems, and it is an object of the present invention to provide a substrate for a light-emitting device, which is provided with a reflection layer having a high optical reflectance and is less susceptible to deterioration of the reflectance and which has an improved light extraction efficiency, and a light-emitting device employing such a substrate.

Another object is to provide a substrate for mounting a light-emitting element capable of co-firing a reflection layer on a substrate and a vitreous insulating layer to protect the reflection layer, in order to suppress the load on the process for producing such a reflection layer.

Means to Accomplish the Objects

The present invention provides a substrate for mounting a light-emitting element, which comprises a substrate main body having a mounting surface on which a light-emitting element is to be mounted, a reflection layer formed on a part of the mounting surface of the substrate main body and containing silver to reflect light emitted from the light-emitting element, and a vitreous insulating layer formed on the reflection layer, wherein the vitreous insulating layer contains a glass comprising, as its constituting components, at least $SiO_2$, at least one of $Al_2O_3$ and $B_2O_3$, and an alkali metal oxide (containing at least one member selected from $Li_2O$, $Na_2O$ and $K_2O$), wherein by contents as represented by mol % based on oxides of the above components, ($Li_2O+Na_2O+K_2O$)—$Al_2O_3$ is from −20 to 1.5%, and $SiO_2+3\times Al_2O_3$ is at most 90%.

In the substrate for mounting a light-emitting element, as a detailed glass composition, the glass comprises, as represented by mol % based on oxides, from 35 to 85% of $SiO_2$, from 0 to 20% of $Al_2O_3$, from 0 to 25% of $B_2O_3$, more than 5 to 40% of at least one member selected from CaO, SrO and BaO, from 0 to 40% of CaO, from 0 to 14% of SrO and from 0 to 7% of BaO, and more than 1 to 7% of at least one member selected from $Li_2O$, $Na_2O$ and $K_2O$. Or, in the substrate for mounting a light-emitting element, the glass comprises, as represented by mol % based on oxides, from 35 to 85% of $SiO_2$, more than 5 to 20% of $Al_2O_3$, from 0 to 25% of $B_2O_3$, from 0 to 5% of at least one member selected from CaO, SrO and BaO, and more than 1 to 7% of at least one member selected from $Li_2O$, $Na_2O$ and $K_2O$. Or, in the substrate for mounting a light-emitting element, the glass comprises, as represented by mol % based on oxides, from 35 to 70% of $SiO_2$, from 1 to 15% of $Al_2O_3$, from 7 to 25% of $B_2O_3$, from 0 to 30% of at least one member selected from CaO, SrO and BaO, and more than 1 to 7% of at least one member selected from $Li_2O$, $Na_2O$ and $K_2O$.

Further, in the substrate for mounting a light-emitting element, the vitreous insulating layer contains a ceramics filler in addition to the glass. Further, a connection terminal area for the light-emitting element is formed on the substrate main body, and the vitreous insulating layer is formed in a region other than the connection terminal area. Furthermore, the substrate main body has a concave, and the bottom surface of the concave is the mounting surface on which a light-emitting element is to be mounted.

The light-emitting device of the present invention comprises the above the substrate for mounting a light-emitting element, a light-emitting element mounted on the vitreous insulating layer of the substrate for mounting a light-emitting element, and a phosphor layer covering the light-emitting element.

Advantageous Effects of the Invention

In the substrate for mounting a light-emitting element of the present invention, the reflection layer containing silver is covered by the vitreous insulating layer, whereby it is possible to prevent a change (a change by corrosion) such as oxidation or sulfurization of the reflection layer, and it is possible to prevent deterioration of the reflectance of the reflection layer.

Further, in the present invention, the quantitative relations between the alkali metal oxide and $Al_2O_3$, and between $SiO_2$ and $Al_2O_3$, in the glass constituting the vitreous insulating layer, are defined, whereby a silver colloid tends to be hardly formed even if silver contained in the reflection layer diffuses into the glass, and it is thereby possible to prevent silver coloring.

In the light-emitting device of the present invention, the above-described substrate for mounting a light-emitting element is used, whereby the reflectance of the reflection layer tends to hardly deteriorate, and it can be expected to maintain the luminous efficiency for a long period of time.

BEST MODE FOR CARRYING OUT THE INVENTION

Now, embodiments of the present invention will be described in detail.

Figure 1:
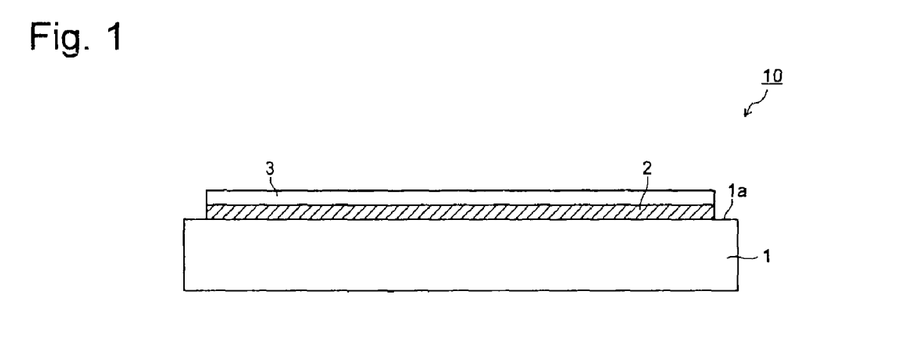
FIG. 1 is a cross-sectional view illustrating an example of the substrate for mounting a light-emitting element of the present invention.
Figure 2:
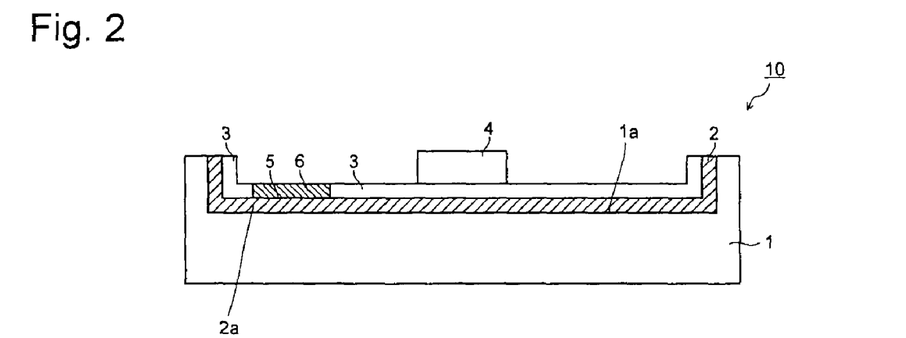
FIG. 2 is a cross-sectional view illustrating another example of the substrate for mounting a light-emitting element of the present invention, and shows a state wherein a light-emitting element is disposed on the substrate.

FIG. 1 is a cross-sectional view illustrating an example of the substrate for mounting a light-emitting element of the present invention. As shown in the Fig., the substrate 10 for mounting a light-emitting element comprises a substrate main body 1 having a mounting surface 1a on which a light-emitting element is to be mounted, a reflection layer (silver reflection layer) 2 formed on a part of the mounting surface 1a of this substrate main body 1 and containing silver to reflect light emitted from the light-emitting element, and a vitreous insulating layer 3 formed on this silver reflection layer 2. FIG. 2 is a cross-sectional view illustrating another example of the substrate 10 for mounting a light-emitting element of the present invention and shows a state wherein a light-emitting element 4 is disposed. In FIG. 2, the light-emitting element 4 is mounted on the vitreous insulating layer 3 formed on the silver reflection layer 2. Further, on the mounting surface 1a of the substrate main body 1, together with the silver reflection layer 2, a wiring conductor layer (silver conductor layer) 2a composed mainly of silver is formed, and the vitreous insulating layer 3 is formed in a region excluding a part of the silver conductor layer. And, the part of the silver conductor layer 2a not covered by the vitreous insulating layer 3 constitutes a connection terminal area 5 to be connected to the light-emitting element 4. Further, on the connection terminal area 5, a gold-plated layer 6 may be formed for the protection of the connection terminal area 5 and for securing the connection strength of the after-mentioned bonding wire.

The vitreous insulating layer 3 contains, as the main component, a glass (hereinafter sometimes referred to as the glass of the present invention) comprising, as the constituting components, at least $SiO_2$, at least one of $Al_2O_3$ and $B_2O_3$, and an alkali metal oxide (containing at least one member selected from $Li_2O$, $Na_2O$ and $K_2O$), wherein by contents as represented by mol % based on oxides of the above components, $(Li_2O+Na_2O+K_2O)-Al_2O_3$ is from $-20$ to $1.5\%$, and $SiO_2+3\times Al_2O_3$ is at most $90\%$. The vitreous insulating layer may contain a ceramics filler in addition to the glass of the present invention. The glass of the present invention may, for example, be glass A, B or C, having the following composition.

Glass A is a glass comprising, as represented by mol % based on oxides, from 35 to 85% of $SiO_2$, from 0 to 20% of $Al_2O_3$, from 0 to 25% of $B_2O_3$, more than 5 to 40% of at least one member selected from CaO, SrO and BaO, from 0 to 40% of CaO, from 0 to 14% of SrO and from 0 to 7% of BaO, and more than 1 to 7% of at least one member selected from $Li_2O$, $Na_2O$ and $K_2O$, wherein $(Li_2O+Na_2O+K_2O)-Al_2O_3$ is from $-20$ to $1.5\%$, and $SiO_2+3\times Al_2O_3$ is at most $90\%$.

Glass B is a glass comprising, as represented by mol % based on oxides, from 35 to 85% of $SiO_2$, more than 5 to 20% of $Al_2O_3$, from 0 to 25% of $B_2O_3$, from 0 to 5% of at least one member selected from CaO, SrO and BaO, and more than 1 to 7% of at least one member selected from $Li_2O$, $Na_2O$ and $K_2O$, wherein $(Li_2O+Na_2O+K_2O)-Al_2O_3$ is from $-20$ to $1.5\%$, and $SiO_2+3\times Al_2O_3$ is at most $90\%$.

Further, Glass C is a glass comprising, as represented by mol % based on oxides, from 35 to 70% of $SiO_2$, from 1 to 15% of $Al_2O_3$, from 7 to 25% of $B_2O_3$, from 0 to 30% of at least one member selected from CaO, SrO and BaO, and more than 1 to 7% of at least one member selected from $Li_2O$, $Na_2O$ and $K_2O$, wherein $(Li_2O+Na_2O+K_2O)-Al_2O_3$ is from $-20$ to $1.5\%$, and $SiO_2+3\times Al_2O_3$ is at most $90\%$.

In the substrate 10 for mounting a light-emitting element of the present invention, the silver reflection layer 2 is covered by the vitreous insulating layer 3, whereby a change (a change by corrosion) such as oxidation or sulfurization of the silver reflection layer 2 is prevented. As a result, deterioration of the reflectance of the silver reflection layer 2 can be prevented.

The substrate main body 1 is, as shown in FIG. 1, an entirely flat plate-form member or, as shown in FIG. 2, a member having a concave formed so that a mounting surface 1a on which a light-emitting element 4 is mounted, is located at a position lower by one step. The material constituting the substrate main body 1 is not particularly limited, but one which undergoes no deformation even when a paste of the composition composed mainly of glass is applied and fired in the step of forming the above glass insulating layer 3, is preferred, and an inorganic material is preferred. From the viewpoint of the thermal conductivity, heat dissipating property, strength and costs, among inorganic materials, an alumina ceramics, a low temperature co-fired ceramic (hereinafter referred to as LTCC) or aluminum nitride is, for example, preferred. In the case of LTCC, the substrate main body 1, the silver reflection layer 2 and the vitreous insulating layer 3 covering this silver reflection layer 2 can be formed by co-firing. Further, in the case of a structure wherein a plurality of layers are laminated by LTCC, an internal wiring layer for power supply can be co-fired at the same time. The raw material composition for the inorganic material constituting the substrate main body 1, the firing conditions, etc. will be described in the production method given hereinafter.

As the constituting material for the silver reflection layer 2, silver is mainly used from the viewpoint of a high reflectance, but a silver alloy such as a silver/palladium alloy or a silver/platinum alloy may also be used.

The vitreous insulating layer 3 is a layer to protect the silver reflection layer 2 as an underlayer from e.g. corrosion (particularly oxidation or sulfurization of silver) and is one formed by dense glass, or glass and a ceramics filler. The glass contained in the vitreous insulating layer 3 is a component to densify the vitreous insulating layer 3 and is preferably colorless not to deteriorate the reflectance. This glass is preferably one which can be co-fired together with the silver reflection layer 2, and it is preferably one which undergoes no coloring (no silver coloring) when co-fired together with the silver reflection layer 2. That is, in a case where the silver reflection layer 2 and glass are co-fired, if the firing temperature exceeds 900° C., the silver reflection layer 2 undergoes deformation, and accordingly, the glass contained in the vitreous insulating layer 3 is required to be densified by firing at a temperature of at most 900° C.

Here, silver coloring is such that during the firing of the vitreous insulating layer 3, silver ions from the silver reflection layer 2 diffuse into the glass and such silver ions will form a colloid which is colored yellow or red.

Diffusion of silver (silver ions, etc.) into the glass tends to increase as the softening point of the glass is low. On the other hand, in order to obtain a dense vitreous insulating layer 3 by firing, it is necessary to make the softening point of the glass low. Therefore, it has been considered difficult to satisfy both requirements of suppressing silver coloring and letting the glass well flow for densification during the firing.

The present inventors have studied a glass composition for a vitreous insulating layer 3 having a very small light absorption without lowering the function as a silver reflection layer 2 and as a result, have found a glass composition which is colorless and free from silver coloring. The first glass composition is one (glass A) comprising, as represented by mol % based on oxides, from 35 to 85% of $SiO_2$, from 0 to 20% of $Al_2O_3$, from 0 to 25% of $B_2O_3$, more than 5 to 40% of at least one member selected from CaO, SrO and BaO, from 0 to 40% of CaO, from 0 to 14% of SrO and from 0 to 7% of BaO, and more than 1 to 7% of at least one member selected from $Li_2O$, $Na_2O$ and $K_2O$, wherein $(Li_2O+Na_2O+K_2O)-Al_2O_3$ is from −20 to 1.5%, and $SiO_2+3\times Al_2O_3$ is at most 90%. The second glass composition is one (glass B) comprising, as represented by mol % based on oxides, from 35 to 85% of $SiO_2$, more than 5 to 20% of $Al_2O_3$, from 0 to 25% of $B_2O_3$, from 0 to 5% of at least one member selected from CaO, SrO and BaO, and more than 1 to 7% of at least one member selected from $Li_2O$, $Na_2O$ and $K_2O$, wherein $(Li_2O+Na_2O+K_2O)-Al_2O_3$ is from −20 to 1.5%, and $SiO_2+3\times Al_2O_3$ is at most 90%. Further, the third glass composition is one (glass C) comprising, as represented by mol % based on oxides, from 35 to 70% of $SiO_2$, from 1 to 15% of $Al_2O_3$, from 7 to 25% of $B_2O_3$, from 0 to 30% of at least one member selected from CaO, SrO and BaO, and more than 1 to 7% of at least one member selected from $Li_2O$, $Na_2O$ and $K_2O$, wherein $(Li_2O+Na_2O+K_2O)-Al_2O_3$ is from −20 to 1.5%, and $SiO_2+3\times Al_2O_3$ is at most 90%.

Now, the vitreous insulating layer 3 will be described in further detail. The vitreous insulating layer 3 is a layer of glass alone or a layer containing glass and a ceramics filler.

The thickness of the vitreous insulating layer 3 is typically from 5 to 30 μm. If it is less than 5 μm, the covering property tends to be inadequate, and accordingly, it is preferably at least 5 μm. If it exceeds 30 μm, the heat dissipating properties of the light-emitting element 4 are likely to be impaired, and the luminous efficiency is likely to deteriorate.

The vitreous insulating layer 3 is formed, for example, by forming a glass powder or a mixture of a glass powder and a ceramics filler into a paste, which is screen-printed, followed by firing. However, the forming method is not particularly limited so long as it is a method capable of forming a layer having a thickness of from 5 to 30 μm to be flat.

The vitreous insulating layer preferably contains the glass in an amount of at least 50% as represented by vol %. If it is less than 50%, sintering during the firing tends to be inadequate, and the covering properties tend to be impaired. In order to improve the sintering properties, the glass is preferably contained in an amount of at least 70%. Further, the ceramics filler is contained in an amount of at most 50%.

The content of the ceramics filler is typically at least 5%. By incorporating the ceramics filler, the strength of the vitreous insulating layer 3 may sometimes be increased. Further, the heat dissipating properties of the vitreous insulating layer 3 may sometimes be increased.

The above ceramics filler (hereinafter sometimes referred to as the ceramics filler for insulating layer) is preferably white or transparent one having little light absorption, and specifically, an alumina powder, a silica powder, a zirconia powder or the like is preferred. The particle size, shape, etc. of the ceramics filler for insulating layer are not particularly limited, but, for example, one having an average particle size $D_{50}$ of from about 0.5 to 2 μm, is employed. Here, in this specification, the 50% particle size ($D_{50}$) is one measured by means of a laser diffraction/scattering type particle size distribution measuring apparatus.

Now, the respective components of glasses (glass A, glass B and glass C) constituting the vitreous insulating layer 3 will be described. In the following, unless otherwise specified, the composition is shown by mol %, which is represented simply by %.

$SiO_2$ is a glass network former, and it is a component to increase chemical durability, particularly acid resistance and thus is essential. If it is less than 35%, the acid resistance is likely to be inadequate. If it exceeds 85%, the melting temperature of the glass tends to be high, or the glass softening point (Ts) tends to be too high.

$B_2O_3$ is not an essential component, but it is a glass network former and a component to lower the softening point, and thus should better be contained. If it is less than 5%, the glass melting temperature tends to become high, or the glass tends to be unstable. Further, silver coloring is likely to occur. Its content is more preferably at least 7%. If it exceeds 25%, it becomes difficult to obtain a stable glass, or the chemical durability may deteriorate. Here, when no $Al_2O_3$ is contained, for suppressing silver coloring, $B_2O_3$ should preferably be contained as essential.

$Al_2O_3$ is essential in a case where at least one member selected from CaO, SrO and BaO is contained in a total amount of at most 5%, and in order to increase the stability of the glass, it is required to be incorporated in an amount of more than 5%. If it exceeds 20%, the softening point of the glass tends to increase, and the sintering properties at the time of firing are likely to be impaired. Accordingly, in order to lower the softening point, it will be required to increase the content of other softening point-lowering components such as $B_2O_3$, or $Li_2O$, $Na_2O$ and $K_2O$, whereby silver coloring is likely to occur.

In a case where at least one member selected from CaO, SrO and BaO is contained in an amount of more than 5%, in order to increase the stability or chemical durability of the glass, $Al_2O_3$ may be contained within a range of at most 20%. If it exceeds 20%, the softening point of the glass tends to increase, whereby the sintering properties at the time of firing are likely to be impaired. Accordingly, in order to lower the softening point, it will be required to increase the contents of other softening point-lowering components such as $B_2O_3$ or $Li_2O$, $Na_2O$ and $K_2O$, whereby silver coloring is likely to occur.

The relation of $Al_2O_3$ to the silver coloring behavior will be described further. Firstly, the mechanism of formation of the silver coloring may be described as follows. First, in the vitreous insulating layer 3 formed by firing to cover the silver reflection layer 2, as the firing progresses, the silver diffuses into the glass of the vitreous insulating layer 3. The silver in the glass is considered to be in the form of silver ions and usually present as $Ag^+$. Further, in a case where such silver ions move in the glass, gather and are reduced, they become $Ag^0$ to form a colloid, thus bringing about light absorption. This light absorption is detected as so-called silver coloring.

In consideration of this mechanism, if the silver is present in the glass in the form of silver ions, no light absorption will be brought about, and no silver coloring will be detected. That is, it is an effective means to suppress silver coloring to let the silver stay in the form of silver ions in the glass.

In the present invention, a glass containing $SiO_2$ as the skeleton is selected since it is thereby easy to secure the stability of the glass, availability of the raw material and chemical durability required in e.g. a plating step. With respect to the relation between an alkali component and alumina in the glass containing $SiO_2$ as the skeleton, the following is known. Firstly, if an alkali component is introduced into the glass having $SiO_2$ as the skeleton, the alkali metal atoms will destroy the bond between a silicon atom and an oxygen atom, i.e. a crosslinkage of Si—O—Si in the glass and will enter in the form of an ion bond of Si—$O^-$:$M^+$ to form a so-called non-crosslinked oxygen. Here, M represents an alkali metal atom.

Here, if $Al_2O_3$ is introduced, firstly, $Al^{3+}$ as an aluminum ion will attract a non-crosslinked oxygen in the glass to take a form of a tetracoordination structure $[AlO_4]$, wherein the Al at the center will take a negatively charged form. To compensate such a negative charge, it takes a form of attracting $M^+$ (an alkali metal ion) having a positive charge. As an element taking a similar structure, B (boron) is also known, but Al (aluminum) is said to more preferentially takes this form than B. When it takes such a structure, the number of non-crosslinked oxygen atoms in the structure of the entire glass is reduced, whereby the structure of the glass network will be strong.

Here, when Ag (silver) is considered, like an alkali metal atom, Ag takes monovalency, and it is considered that when it is present as an ion in the glass, it becomes $Ag^+$ and shows the same behavior as an alkali metal atom. That is, $Al^{3+}$ attracts a non-crosslinked oxygen in the glass to take a form of tetra-coordination $[AlO_4]$, wherein Al at the center takes a negatively charged form. To compensate such a charge, it takes a form of attracting $Ag^+$ (silver ion) having a positive charge. Silver ions in the glass do not cause coloring, and it is considered that by taking such a structure where silver ions are stably present, silver coloring tends to hardly occur.

$Li_2O$, $Na_2O$ and $K_2O$ being alkali metal oxides are useful as components to lower the softening point. However, if the content is too large, silver coloring tends to occur. One factor for this is that non-crosslinked oxygen increases in the glass, whereby silver ions tend to more readily diffuse in the glass, but if $Al_2O_3$ is introduced, silver coloring is suppressed. The present inventors have found that the difference between the total of $Li_2O$, $Na_2O$ and $K_2O$ and the $Al_2O_3$ content is related to silver coloring. That is, when components are represented by mol % based on oxides, ($Li_2O+Na_2O+K_2O$)—$Al_2O_3$ is preferably from −20 to 1.5%. It is considered that within this range, even if the silver ions diffuse into the glass, they take such a structure that they can be stably present in the form of silver ions. If the difference is less than −20%, silver coloring is likely to occur. Further, if it exceeds 1.5%, silver coloring is likely to occur. The range of ($Li_2O+Na_2O+K_2O$) is preferably more than 1 to 7%, more preferably from 2 to 7%.

Then, in a case where $Al_2O_3$ is excessive, it is known that in the glass, Al takes a hexacoordination structure and behaves as a so-called modified element. In such a case, Al behaves to increase non-crosslinked oxygen, whereby the glass tends to take a structure having many spaces. Further, Al will not take a form of attracting ions having a positive charge such as $Ag^+$. That is, the silver ions tend to be hardly stably present in the glass. It is considered that at that time, alkali metal atoms and silver ions become readily movable in the glass, and silver ions gather to increase the possibility to form a colloid. The present inventors have found that if the sum of the $SiO_2$ content and the three times of the $Al_2O_3$ content is too large, silver coloring is likely to occur. That is, the content of $SiO_2$+ 3×$Al_2O_3$ is preferably at most 90%. If it exceeds 90%, silver coloring is likely to occur. The range of $Al_2O_3$ is preferably from 5 to 15%.

When $Al_2O_3$ exceeds 5%, any one of CaO, SrO and BaO is not essential, but they are useful to lower the melting temperature of the glass or to stabilize the glass. However, if the content is too large, the glass tends to be unstable, or silver coloring is likely to occur. CaO may be contained in an amount of at most 40%. If it exceeds 40%, the glass tends to be unstable. It is more preferably at most 30%. SrO may be contained in an amount of at most 14%. If it exceeds 14%, silver coloring is likely to occur. BaO may be contained in an amount of at most 7%. If it exceeds 7%, silvering coloring is likely to occur.

When $Al_2O_3$ is at most 5%, it is necessary that at least one of CaO, SrO and BaO is contained in their total amount of more than 5% in order to stabilize the glass. Further, they are useful to lower the melting point of the glass. However, if the content is too large, the glass is likely to be unstable, or silver coloring is likely to occur. CaO may be contained in an amount of at most 40%. If it exceeds 40%, the glass is likely to be unstable. It is more preferably at most 30%. SrO may be contained in an amount of at most 14%. If it exceeds 14%, silver coloring is likely to occur. BaO may be contained in an amount of at most 7%. If it exceeds 7%, silver coloring is likely to occur.

In the present invention, the glass to constitute the vitreous insulating layer 3, i.e. the glass of the present invention essentially comprises the above components as the main components, but may contain other components within a range not to impair the purpose of the present invention. In a case where such other components are to be contained, their total content is preferably at most 10%. However, no lead oxide is contained.

In the substrate 10 for mounting a light-emitting element of the present invention, the light-emitting element 4 to be mounted may be a LED element. More specifically, it may be one capable of emitting a visible light by exciting a phosphor by radiated light. For example, a blue light-emitting type LED element or a ultraviolet light-emitting type LED element may be exemplified. However, without being limited to such exemplified ones, various light-emitting elements may be used depending upon the particular applications or desired emission colors of the light-emitting devices, so long as they are light-emitting elements capable of emitting visible light by exciting phosphors.

In the substrate 10 for mounting a light-emitting element of the present invention, the material to constitute the substrate main body 1 is not particularly limited so long as the silver reflection layer 2 and the vitreous insulating layer 3 to protect it can be sequentially formed thereon. However, as mentioned above, a ceramics such as alumina or aluminum nitride, or LTCC, is preferred. In the following, firstly, a case where the substrate main body 1 is a LTCC substrate, will be described, and then, a case where the substrate main body 1 is a ceramics substrate such as an alumina substrate will be described.

The LTCC substrate is a substrate which is produced by firing a composition (hereinafter referred to as a glass ceramics composition) prepared by mixing a glass powder and a ceramics filler, and is a substrate which can be produced by co-firing together with the silver reflection layer 2.

The composition of glass constituting the LTCC substrate may, for example, comprise, as represented by mol % based on oxides, 60.4% of $SiO_2$, 15.6% of $B_2O_3$, 6% of $Al_2O_3$, 15% of CaO, 1% of $K_2O$ and 2% of $Na_2O$.

The glass powder to be used for the production of the LTCC substrate is produced by grinding glass obtained by a melting method. The grinding method is not particularly limited so long as the object of the present invention is not impaired and may be either wet grinding or dry grinding. In the case of wet grinding, it is preferred to use water as a solvent. Further, for grinding, a grinding machine such as a roll mill, a ball mil or a jet mill may suitably be used. The glass after grinding is dried and classified as the case requires.

As the ceramics filler, one which has been commonly used for the production of a LTCC substrate can be used. For example, an alumina powder, a zirconia powder or a mixture of an alumina powder and a zirconia powder, can be suitably used. Now, a LTCC substrate wherein an alumina powder is used as the ceramics filler, will be described.

The particle size, shape, etc. of the alumina powder are not particularly limited. Typically, however, one having an average particle size $D_{50}$ of from about 1 to 5 μm is used. For example, AL-45H manufactured by Showa Denko K.K. may be mentioned. The blend ratio of the glass powder to the alumina powder is typically 40 mass % of the glass powder to 60 mass % of the alumina powder.

The substrate 10 for mounting a light-emitting element having a LTCC substrate as the substrate main body 1 can be produced as shown below by using a green sheet made of a composition prepared by mixing a glass powder and the above alumina powder. Firstly, to the glass powder and the alumina powder, a resin such as a polyvinyl butyral resin or an acrylic resin and, as the case requires, a plasticizer such as dibutyl phthalate, dioctyl phthalate or butylbenzyl phthalate, etc. are added and mixed, and further, a solvent such as toluene, xylene or butanol is added to obtain a slurry. This slurry is formed in to a sheet by e.g. a doctor blade method on a film of e.g. polyethylene terephthalate (PET). Finally, the one formed into a sheet is dried to remove the solvent to obtain a green sheet (a glass ceramics green sheet).

On the surface of such a green sheet, a non-fired silver reflection layer is formed by e.g. screen printing by using a silver paste prepared by adding a vehicle such as ethylcellulose and, as the case requires, a solvent, etc. to a powder of silver or a silver alloy such as a silver/palladium alloy or a silver/platinum alloy to form a paste. Further, as the case requires, a non-fired wiring conductor layer is formed by e.g. screen printing by using the above silver paste or a known silver paste. Further, via holes for e.g. interlayer connection are formed on the green sheet, and the above silver paste is filled in such via holes to form non-fired connection vias or thermal vias.

Then, on the non-fired silver reflection layer, etc., a paste (hereinafter referred to as a glass paste) of a mixture comprising a powder of the glass of the present invention having the above-described composition and the above-described ceramics filler for insulating layer (alumina powder) is printed by e.g. screen printing to form a non-fired vitreous insulating layer.

Then, one sheet of such a green sheet or a laminate of a plurality of such green sheets is heated to a temperature of from 500 to 600° C. to carry out binder burn out to decompose and remove a binder such as a resin contained in the green sheets, etc., followed by firing, and then, as the case requires, processing into a desired shape is carried out to obtain a substrate. The firing is carried out typically at a temperature of from 850 to 900° C. for from 20 to 60 minutes. A more typical firing temperature is from 860 to 880° C. By such firing, the above-mentioned non-fired silver reflection layer, non-fired wiring conductor layers, non-fired connection vias, etc. are also fired at the same time.

In a case where the silver reflection layer, etc. are fired at the same time as the green sheet, the firing temperature is preferably at most 880° C. If it exceeds 880° C., silver or a silver-containing alloy is likely to be softened at the time of firing, so that the shapes of the silver reflection layer, wiring conductor layers, connection vias, etc. may not be maintained. More preferably, the firing temperature is at most 870° C. Thus, a substrate 10 for mounting a light-emitting element is obtained wherein a silver reflection layer 2 is formed on the surface of the LTCC substrate as the substrate main body 1, and a vitreous insulating layer 3 is formed thereon to cover it.

Now, a method for producing a substrate 10 for mounting a light-emitting element having a ceramics substrate as the substrate main body 1 will be described. Firstly, a ceramics green sheet is prepared to produce a ceramics substrate. The ceramics green sheet can be formed by adding a binder and, as the case requires, a plasticizer, a solvent, etc. to a ceramics composition comprising a ceramics powder and a sintering aid to form a slurry, forming the slurry into a sheet by e.g. a doctor blade method, followed by drying.

As the ceramics powder, an alumina powder or an aluminum nitride powder may be used. The 50% particle size ($D_{50}$) of the ceramics powder is preferably from 0.5 μm to 2 μm. If $D_{50}$ of the ceramics powder is less than 0.5 μm, the ceramics powder is likely to cohere, and not only the handling tends to be difficult, but also it becomes difficult to uniformly disperse it. On the other hand, if $D_{50}$ exceeds 2 μm, sintering deficiency is likely to occur.

As the sintering aid, one which has been commonly used for the production of a ceramics substrate, may be used. For example, a mixture of $SiO_2$ and an alkaline earth metal oxide, or a rare earth element oxide (particularly a $Y_2O_3$-type aid composed mainly of $Y_2O_3$) may be suitably used. $D_{50}$ of the sintering aid is preferably from 0.5 μm to 4 μm.

Such a ceramics powder and a sintering aid are blended and mixed, for example, so that the ceramics powder would be from 80 mass % to 99 mass %, and the sintering aid would be from 1 mass % to 20 mass %, to obtain a ceramics composition, and to such a ceramics composition, a binder and, as the case requires, a plasticizer, a solvent, etc. are added to obtain a slurry.

As the binder, it is possible to suitably use, for example, a polyvinyl butyral or an acrylic resin. As the plasticizer, it is possible to use, for example, dibutyl phthalate, dioctyl phthalate or butylbenzyl phthalate. Further, as the solvent, it is possible to use an aromatic or alcohol-type organic solvent such as toluene, xylene or butanol. Further, a dispersing agent or a leveling agent may also be used.

The ceramics green sheet thus formed is, as the case requires, cut into a prescribed size, and via holes for interlayer connection, etc. are formed. Then, one green sheet or a laminate of a plurality of green sheets integrated by heating and pressing, is heated at a temperature of from 500° C. to 600° C. to carry out binder burn out to decompose and remove a binder such as a resin contained in the green sheet. Then, heating is carried out further at a temperature of from about 1,100 to 2,200° C. to fire the ceramics composition to obtain a ceramics substrate.

Then, on the ceramics substrate thus obtained, the above-mentioned silver paste is printed by e.g. screen printing to form a non-fired silver reflection layer. Further, as the case requires, non-fired wiring conductor layers, non-fired connection vias, thermal vias, etc. are formed by using the above silver paste or the like. Further, on the non-fired silver reflection layer, etc., the above-mentioned glass plate is printed by e.g. screen printing to form a non-fired vitreous insulating layer.

Then, the ceramics substrate having the non-fired silver reflection layer and the non-fired vitreous insulating layer, etc. formed thereon is heated at a temperature of from 850 to 900° C. for from 20 to 60 minutes to fire the above silver paste and glass paste at the same time to form the silver reflection layer 2 and the vitreous insulating layer 3 at the same time. A typical firing temperature is from 860 to 880° C.

Further, the silver reflection layer 2 and the vitreous insulating layer 3 may be separately fired (hereinafter sometimes referred to as individual firing). That is, after printing the silver paste on the ceramics substrate by e.g. screen printing, the silver paste is fired to form a silver reflection layer 2. Then, on the formed silver reflection layer 2, the glass paste is printed, and this glass paste is fired to form a vitreous insulating layer 3. Thus, a substrate 10 for mounting a light-emitting element is obtainable wherein the silver reflection layer 2 is formed on the ceramics substrate as the substrate main body 1, and the vitreous insulating layer 3 is formed thereon to cover it.

In the foregoing, the substrate 1 for mounting a light-emitting element of the present invention has been described, but the construction may suitably be changed within a range not to depart from the concept of the present invention or as the case requires.

Figure 3:
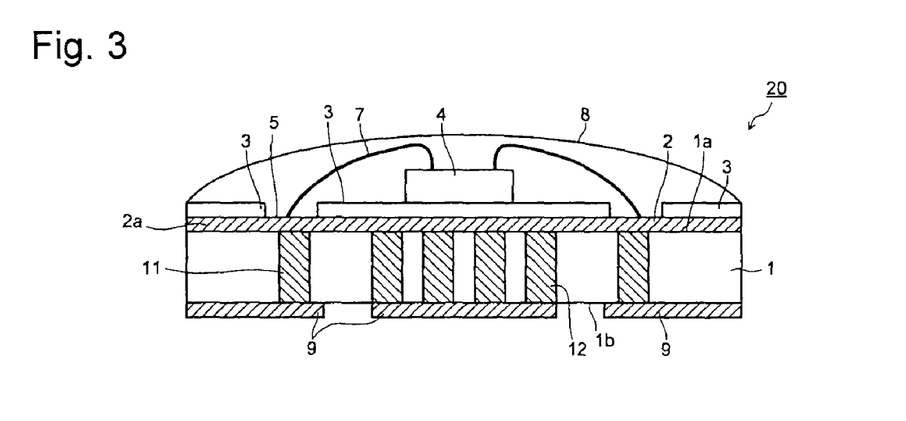
FIG. 3 is a cross-sectional view illustrating an example of the light-emitting device of the present invention.

Now, a light-emitting device of the present invention will be described. For example, as shown in FIG. 3, the light-emitting device 20 has a structure wherein a light-emitting element 4 such as a LED element is mounted on the substrate 10 for mounting a light-emitting element of the present invention. In the substrate 10 for mounting a light-emitting element, on the mounting surface 1a of the substrate main body 1, a wiring conductor layer (silver conductor layer) 2a composed mainly of silver is formed together with the silver reflection layer 2, and parts of the silver conductor layer 2a constitute connection terminal areas 5 for the light-emitting element 4. And, the region excluding such connection terminal areas 5 is covered by the vitreous insulating layer 3.

The light-emitting element 4 is bonded (die-bonded) on the vitreous insulating layer 3 formed on the silver reflection layer 2, by means of e.g. an epoxy resin or a silicone resin, and electrodes (not shown) on the upper surface of the light-emitting element 4 are electrically connected to the above-mentioned connection terminal areas 5 via bonding wires 7 such as gold wires. Mounting of the light-emitting element 4 may be carried out by a method wherein a bump electrode such as a solder bump, an Au bump or an Au—Sn eutectic crystal bump provided on the rear side of the light-emitting element 4 is connected to a lead terminal or pad portion of the substrate main body 1.

And, a phosphor layer 8 is provided to cover the light-emitting element 4 and the bonding wires 7. The phosphor layer 8 is one having a phosphor mixed and dispersed in a transparent resin such as a silicone resin or an epoxy resin. The phosphor is excited by light radiated from the light-emitting element 4 to emit visible light, and by color mixing of this visible light and light radiated from the light-emitting element 4, or by color mixing of visible light emitted from the phosphor or visible light itself, a desired emission color as a light-emitting device 20 is obtained. The type of the phosphor is not particularly limited and may suitably be selected depending upon the desired emission color, the light radiated from the light-emitting element 4, etc.

Further, it is also possible to form a covering layer made of a transparent resin or the like to directly cover the light-emitting element 4 and to provide a phosphor layer 8 on the covering layer. That is, the phosphor layer 8 is preferably formed as the topmost layer on the side where the light-emitting element 4 of the light-emitting device 20 is formed.

Further, in this light-emitting device 20, external electrode terminals 9 to be electrically connected to an external circuit, are formed by printing and firing of a silver paste in the same manner as e.g. the above silver conductor layer 2a on a non-mounting surface 1b on the opposite side to the mounting surface 1a of the substrate main body 1. And, connection vias 11 which electrically connect the external electrode terminals 9 to the above connection terminal areas 5 of the light-emitting element, are provided in the substrate main body 1 therethrough. Further, in the substrate main body 1, thermal vias 12 to reduce heat resistance are embedded. The thermal vias 12 are formed, for example, by printing and firing of a silver paste as mentioned in the above method for producing a substrate 10 for mounting a light-emitting element, and a plurality of thermal vias are provided immediately under the light-emitting element-mounting portion.

According to the light-emitting device 20 constructed as described above, the reflectance of the silver reflection layer 2 scarcely deteriorates, and the emission efficiency can be maintained for a long period of time.

EXAMPLES

Now, the present invention will be described in further detail with reference to Examples.

In each of Examples 1 to 59, glass to form a vitreous insulating layer was prepared. That is, glass raw materials were blended and mixed so that the respective components of $SiO_2$, $B_2O_3$, $ZnO$, $Al_2O_3$, $MgO$, $CaO$, $SrO$, $BaO$, $R_2O$ ($Li_2O$, $Na_2O$, $K_2O$), $TiO_2$ and $ZrO_2$ would constitute a composition (mol %) shown in Tables 1 to 7, and this raw material mixture was put into a platinum crucible and melted at from 1,500 to 1,600° C. for 60 minutes. Then, the molten state glass was cast and cooled. The obtained glass was ground for from 20 to 60 hours by a ball mill made of alumina by using water as a solvent to obtain a glass powder.

The average particle size $D_{50}$ of the obtained glass powder was measured by means of SALD2100 manufactured by Shimadzu Corporation, and in each case, $D_{50}$ was within a range of from 1 to 3 μm. Further, the softening point Ts (unit: ° C.) of each glass powder was measured up to 1,000° C. under a condition of a temperature raising rate of 10° C./min by means of a thermal analysis equipment TG-DTA2000 manufactured by Bruker AXS K.K. The measuring results are shown in Tables 1 to 7. Here, with respect to the glass in each of Examples 1 to 59, no crystalline peak was observed at the time of measuring Ts.

The glass having a composition shown in each of Examples 1 to 26 and Examples 36 to 51, is a glass of the present invention which contains at least $SiO_2$, at least one of $Al_2O_3$ and $B_2O_3$, and $R_2O$, wherein ($R_2O$—$Al_2O_3$) is from −20 to 1.5%, and ($SiO_2+3\times Al_2O_3$) is at most 90%. The glass having a composition shown in each of Examples 27 to 35 and Examples 52 to 59 is a glass of a Comparative Example having a composition outside the above range.

With respect to Examples 1 to 35, only the glass powder having a composition shown in Tables 1 to 4 was used, and with respect to Examples 36 to 59, a mixed powder prepared by blending to a glass powder having a composition shown in Tables 5 to 7, an alumina powder (AA-2 manufactured by Sumitomo Chemical Co., Ltd.) in a ratio (vol %) shown in the same Tables, was used. And, one comprising, by mass %, 70% of such a glass powder or mixed powder and 30% of a vehicle component having a resin melted in a solvent, was kneaded for 1 hour in a porcelain mortar and further dispersed three times by means of a three roll mill to prepare a glass paste (G-1 to G-59).

Further, a silver paste (S) was prepared by blending an electrical conductive silver powder (S400-2 manufactured by Daiken Chemical Co., Ltd.) and methylcellulose in a mass ratio of 85:15, then dispersing the blend in a solvent α-terpineol) so that the concentration of the solid content became 85%, as represented by mass %, followed by kneading for 1 hour in a porcelain mortar and further by dispersion three times by a three-roll mill.

Then, a substrate for mounting a light-emitting element was produced which had a LTCC substrate as the main body and a silver reflection layer and a vitreous insulating layer sequentially formed thereon. Firstly, as shown in below, a glass ceramics green sheet was prepared. That is, the above raw materials were blended and mixed so that, as represented by mol %, $SiO_2$ became 60.4%, $B_2O_3$ 15.6%, $Al_2O_3$ 6%, CaO 15%, $K_2O$ 1% and $Na_2O$ 2%, and this raw material mixture was put into a platinum crucible and melted at 1,600° C. for 60 minutes. Then, this molten state glass was cast and cooled. This glass was ground for 40 hours by a ball mill made of alumina to obtain a glass powder for the main body. Here, ethyl alcohol was used as a solvent for grinding.

40 mass % of this glass powder for the main body and 60 mass % of an alumina powder (tradename: AL-45H, manufactured by Showa Denko K.K.) were blended and mixed to obtain a glass ceramics composition. To 50 g of this glass ceramics composition, 15 g of an organic solvent (a mixture prepared by mixing toluene, xylene, 2-propanol and 2-butanol in a mass ratio of 4:2:2:1), 2.5 g of a plasticizer (di-2-ethylhexyl phthalate), 5 g of polyvinyl butyral (tradename: PVK#3000K manufactured by DENKI KAGAKU KOGYO KABUSHIKI KAISHA) as a binder and further 0.5 g of a dispersant (tradename: BYK180 manufactured by BYK Japan KK) were blended and mixed to prepare a slurry.

This slurry was applied on a PET film by a doctor blade method and dried to prepare a glass ceramics green sheet which would have a thickness of 150 μm after firing.

On the glass ceramics green sheet thus obtained, the above-mentioned silver paste (S) was printed and dried, then a glass paste (G-1 to G-59) was printed thereon, and the printed product was held at 550° C. for 5 hours to decompose and remove the resin component and then held at 870° C. for 30 minutes to carry out firing. Further, with respect to ones wherein glasses having compositions shown in Examples 1, 3, 5, 9, 12, 17, 18, 19 to 34 and 37 to 59 were used, firing was carried out also at the respective temperatures of 840° C. and 900° C. Thus, a substrate for mounting a light-emitting element having a LTCC substrate as the main body and a vitreous insulating layer formed on a silver reflection layer, was obtained.

Then, using a glass having a composition shown in each of Examples 1, 3, 5, 9, 12, 17, 18, 19 to 34 and 37 to 59, a substrate for mounting a light-emitting element having an alumina substrate as the main body, was prepared by a method wherein the silver paste layer and the glass paste layer were co-fired (co-firing method). Further, the same substrate was prepared by a method wherein the silver paste layer and the glass paste layer were separately fired (individual firing method).

On an alumina substrate (a 96% alumina substrate manufactured by Hokuriku Ceramic), the above silver paste (S) was printed and dried. Then, a glass paste (G-1 to G-59) was printed thereon and held for 30 minutes at each temperature of 840° C., 870° C. and 900° C. to carry out firing. Thus, a substrate for mounting a light-emitting element having the alumina substrate as the main body and the vitreous insulating layer formed on the silver reflection layer by the co-firing method, was obtained.

Further, on the above alumina substrate, the above silver paste (S) was printed and dried and then held for 30 minutes at each temperature of 840° C., 870° C. and 900° C. to carry out firing of the silver paste layer. Then, on the silver layer (reflection layer) thus formed, a glass paste (G-1 to G-59) was printed and held for 30 minutes at each temperature of 840° C., 870° C. and 900° C. to carry out firing of the glass paste layer. Thus, the silver paste layer and the glass paste layer were formed by firing separately.

Then, with respect to the substrate for mounting a light-emitting element having a LTCC substrate as the main body obtained as described above, and the substrate for mounting a light-emitting element having an alumina substrate as the main body and obtained by each of the method of co-firing the silver paste layer and the glass paste layer and the method of individually firing them, the reflectance of the surface was measured respectively. The reflectance was measured by using a spectrometer USB2000 and small sized integrating sphere ISP-RF manufactured by Ocean Optics, and an average value in visible light region of from 400 to 800 nm was calculated as the reflectance (unit: %). Further, with respect to Examples 1 to 20 and 31 to 36, the surface roughness of the vitreous insulating layer was measured by SURFCOM 1400D (name of equipment, manufactured by Tokyo Seimitsu Co., Ltd.). The measuring results are shown in Tables 1 to 7. In the Tables, "-" means that the surface roughness or the reflectance was not measured.

TABLE 1

|  |  | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|---|
| Glass | $SiO_2$ | 60.4 | 54.2 | 47.9 | 55.9 | 46.0 | 60.4 | 60.4 | 64.6 | 41.7 |
| composition | $B_2O_3$ | 15.6 | 15.6 | 15.6 | 19.3 | 20.6 | 15.6 | 15.6 | 9.1 | 15.6 |
| (mol %) | ZnO | 0.0 | 0.0 | 0.0 | 0.0 | 0.0 | 0.0 | 0.0 | 0.0 | 0.0 |

TABLE 1-continued

|  |  |  | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|---|---|
|  | $Al_2O_3$ |  | 6.0 | 6.0 | 6.0 | 6.2 | 13.5 | 6.0 | 6.0 | 5.8 | 6.0 |
|  | MgO |  | 0.0 | 0.0 | 0.0 | 0.0 | 0.0 | 0.0 | 0.0 | 0.0 | 0.0 |
|  | CaO |  | 7.5 | 21.2 | 27.5 | 15.5 | 16.5 | 15.0 | 15.0 | 14.5 | 33.7 |
|  | SrO |  | 7.5 | 0.0 | 0.0 | 0.0 | 0.0 | 0.0 | 0.0 | 0.0 | 0.0 |
|  | BaO |  | 0.0 | 0.0 | 0.0 | 0.0 | 0.0 | 0.0 | 0.0 | 0.0 | 0.0 |
|  | $Li_2O$ |  | 0.0 | 0.0 | 0.0 | 0.0 | 0.0 | 1.0 | 0.0 | 0.0 | 0.0 |
|  | $Na_2O$ |  | 2.0 | 2.0 | 2.0 | 2.1 | 2.2 | 3.0 | 1.0 | 5.0 | 2.0 |
|  | $K_2O$ |  | 1.0 | 1.0 | 1.0 | 1.0 | 1.1 | 0.0 | 1.0 | 1.0 | 1.0 |
|  | $TiO_2$ |  | 0.0 | 0.0 | 0.0 | 0.0 | 0.0 | 0.0 | 0.0 | 0.0 | 0.0 |
|  | $ZrO_2$ |  | 0.0 | 0.0 | 0.0 | 0.0 | 0.0 | 0.0 | 0.0 | 0.0 | 0.0 |
|  | Total |  | 100.0 | 100.0 | 100.0 | 100.0 | 100.0 | 100.0 | 100.0 | 100.0 | 100.0 |
|  | $R_2O$—$Al_2O_3$ |  | −3 | −3.0 | −3.0 | −3.1 | −10.2 | −3.0 | −3.0 | 0.1 | −3.0 |
|  | $R_2O$—($Al_2O_3$ + $B_2O_3$) |  | −18.6 | −18.6 | −18.6 | −22.4 | −30.8 | −18.6 | −18.6 | −9.0 | −18.6 |
|  | $SiO_2$ + 3 × $Al_2O_3$ |  | 78.4 | 72.2 | 65.9 | 74.5 | 86.5 | 78.4 | 78.4 | 82.1 | 59.7 |
| Ts of glass (° C.) |  |  | 803 | 823 | 789 | 801 | 776 | 817 | 831 | 810 | 763 |
| Blend proportions | Glass powder |  | 100 | 100 | 100 | 100 | 100 | 100 | 100 | 100 | 100 |
| (vol %) | Alumina powder |  | 0 | 0 | 0 | 0 | 0 | 0 | 0 | 0 | 0 |
| Surface roughness Ra (μm) |  |  | 0.003 | 0.006 | 0.022 | 0.007 | 0.003 | 0.005 | 0.005 | 0.018 | 0.132 |
| Reflectance (%) | LTCC substrate Ag co-fired | 840° C. | 92.2 | — | 93.8 | — | 92.9 | — | — | — | 90.5 |
|  |  | 870° C. | 93.9 | 92.0 | 94.5 | 93.0 | 94.0 | 93.0 | 93.0 | 93.0 | 91.3 |
|  |  | 900° C. | 94.9 | — | 94.0 | — | 94.6 | — | — | — | 92.8 |
|  | Alumina substrate Ag co-fired | 840° C. | 90.7 | — | 88.8 | — | 90.2 | — | — | — | 80.9 |
|  |  | 870° C. | 90.8 | — | 88.5 | — | 89.9 | — | — | — | 84.5 |
|  |  | 900° C. | 92.9 | — | 89.8 | — | 91.6 | — | — | — | 85.5 |
|  | Alumina substrate Ag individually fired | 840° C. | 91.3 | — | 75.4 | — | 92.1 | — | — | — | 73.5 |
|  |  | 870° C. | 91.7 | — | 81.2 | — | 90.9 | — | — | — | 77.0 |
|  |  | 900° C. | 92.2 | — | 82.3 | — | 92.0 | — | — | — | 76.7 |

TABLE 2

|  |  |  | Ex. 10 | Ex. 11 | Ex. 12 | Ex. 13 | Ex. 14 | Ex. 15 | Ex. 16 | Ex. 17 | Ex. 18 |
|---|---|---|---|---|---|---|---|---|---|---|---|
| Glass composition (mol %) | $SiO_2$ |  | 58.6 | 58.6 | 58.6 | 53.7 | 63.4 | 47.5 | 47.5 | 43.4 | 60.4 |
|  | $B_2O_3$ |  | 12.1 | 12.1 | 12.1 | 15.5 | 11.0 | 16.3 | 13.1 | 16.7 | 15.6 |
|  | ZnO |  | 0.0 | 0.0 | 0.0 | 0.0 | 0.0 | 0.0 | 0.0 | 0.0 | 0.0 |
|  | $Al_2O_3$ |  | 5.8 | 4.6 | 5.8 | 5.0 | 5.9 | 10.8 | 10.8 | 13.8 | 6.0 |
|  | MgO |  | 0.0 | 0.0 | 0.0 | 0.0 | 0.0 | 0.0 | 0.0 | 0.0 | 0.0 |
|  | CaO |  | 20.6 | 20.6 | 10.3 | 10.5 | 14.7 | 22.2 | 22.2 | 22.8 | 15.0 |
|  | SrO |  | 0.0 | 0.0 | 10.3 | 10.5 | 0.0 | 0.0 | 0.0 | 0.0 | 0.0 |
|  | BaO |  | 0.0 | 0.0 | 0.0 | 0.0 | 0.0 | 0.0 | 0.0 | 0.0 | 0.0 |
|  | $Li_2O$ |  | 0.0 | 0.0 | 0.0 | 0.0 | 0.0 | 0.0 | 0.0 | 0.0 | 0.0 |
|  | $Na_2O$ |  | 1.9 | 3.1 | 1.9 | 2.0 | 4.1 | 2.1 | 5.3 | 2.1 | 2.0 |
|  | $K_2O$ |  | 1.0 | 1.0 | 1.0 | 1.0 | 1.0 | 1.0 | 1.0 | 1.1 | 1.0 |
|  | $TiO_2$ |  | 0.0 | 0.0 | 0.0 | 0.0 | 0.0 | 0.0 | 0.0 | 0.0 | 0.0 |
|  | $ZrO_2$ |  | 0.0 | 0.0 | 0.0 | 1.9 | 0.0 | 0.0 | 0.0 | 0.0 | 0.0 |
|  | Total |  | 100.0 | 100.0 | 100.0 | 100.0 | 100.0 | 100.0 | 100.0 | 100.0 | 100.0 |
|  | $R_2O$—$Al_2O_3$ |  | −2.9 | −0.5 | −2.9 | −2.0 | −0.8 | −7.7 | −4.4 | −10.6 | −3.0 |
|  | $R_2O$—($Al_2O_3$ + $B_2O_3$) |  | −15.0 | −12.6 | −15.0 | −17.5 | −11.8 | −24.0 | −17.5 | −27.3 | −18.6 |
|  | $SiO_2$ + 3 × $Al_2O_3$ |  | 76.0 | 72.4 | 76.0 | 68.7 | 81.0 | 80.0 | 80.0 | 84.8 | 78.4 |
| Ts of glass (° C.) |  |  | 858 | 842 | 813 | 793 | 835 | 783 | 762 | 785 | 856 |
| Blend proportions | Glass powder |  | 100 | 100 | 100 | 100 | 100 | 100 | 100 | 100 | 100 |
| (vol %) | Alumina powder |  | 0 | 0 | 0 | 0 | 0 | 0 | 0 | 0 | 0 |
| Surface roughness Ra (μm) |  |  | 0.012 | 0.050 | 0.004 | 0.004 | 0.025 | 0.007 | 0.024 | 0.013 | 0.005 |
| Reflectance (%) | LTCC substrate Ag co-fired | 840° C. | — | — | 90.9 | — | — | — | — | 90.3 | 94.6 |
|  |  | 870° C. | 93.0 | 92.0 | 93.7 | 86.0 | 90.0 | 85.0 | 85.0 | 91.7 | 94.2 |
|  |  | 900° C. | — | — | 95.3 | — | — | — | — | 93.3 | 94.7 |
|  | Alumina substrate Ag co-fired | 840° C. | — | — | 89.6 | — | — | — | — | 89.6 | 88.9 |
|  |  | 870° C. | — | — | 90.0 | — | — | — | — | 89.5 | 90.4 |
|  |  | 900° C. | — | — | 91.5 | — | — | — | — | 89.5 | 91.0 |
|  | Alumina substrate Ag individually fired | 840° C. | — | — | 91.3 | — | — | — | — | 89.5 | 88.3 |
|  |  | 870° C. | — | — | 91.5 | — | — | — | — | 89.4 | 89.3 |
|  |  | 900° C. | — | — | 92.0 | — | — | — | — | 90.1 | 92.1 |

TABLE 3

|  |  | Ex. 19 | Ex. 20 | Ex. 21 | Ex. 22 | Ex. 23 | Ex. 24 | Ex. 25 | Ex. 26 |
|---|---|---|---|---|---|---|---|---|---|
| Glass composition (mol %) | $SiO_2$ | 53.1 | 60.4 | 43.4 | 40.0 | 54.9 | 59.3 | 62.7 | 66.6 |
| | $B_2O_3$ | 15.3 | 15.6 | 13.4 | 14.9 | 15.8 | 15.3 | 16.2 | 16.2 |
| | ZnO | 0.0 | 0.0 | 0.0 | 0.0 | 0.0 | 0.0 | 0.0 | 0.0 |
| | $Al_2O_3$ | 5.9 | 6.0 | 13.8 | 9.9 | 9.2 | 5.9 | 6.2 | 6.2 |
| | MgO | 0.0 | 0.0 | 0.0 | 0.0 | 0.0 | 0.0 | 0.0 | 0.0 |
| | CaO | 10.4 | 7.5 | 22.8 | 32.3 | 15.2 | 14.7 | 7.8 | 3.9 |
| | SrO | 14.3 | 0.0 | 0.0 | 0.0 | 0.0 | 0.0 | 0.0 | 0.0 |
| | BaO | 0.0 | 7.5 | 0.0 | 0.0 | 0.0 | 0.0 | 0.0 | 0.0 |
| | $Li_2O$ | 0.0 | 0.0 | 0.0 | 0.0 | 0.0 | 0.0 | 0.0 | 0.0 |
| | $Na_2O$ | 1.0 | 2.0 | 5.5 | 1.9 | 0.0 | 0.0 | 4.7 | 4.7 |
| | $K_2O$ | 0.0 | 1.0 | 1.1 | 1.0 | 4.9 | 4.8 | 2.3 | 2.3 |
| | $TiO_2$ | 0.0 | 0.0 | 0.0 | 0.0 | 0.0 | 0.0 | 0.0 | 0.0 |
| | $ZrO_2$ | 0.0 | 0.0 | 0.0 | 0.0 | 0.0 | 0.0 | 0.0 | 0.0 |
| | Total | 100.0 | 100.0 | 100.0 | 100.0 | 100.0 | 100.0 | 100.0 | 100.0 |
| | $R_2O - Al_2O_3$ | -4.9 | -3.0 | -7.2 | -7.1 | -4.3 | -1.1 | 0.8 | 0.8 |
| | $R_2O - (Al_2O_3 + B_2O_3)$ | -20.2 | -18.6 | -20.6 | -22.0 | -20.1 | -16.4 | -15.4 | -15.4 |
| | $SiO_2 + 3 \times Al_2O_3$ | 70.8 | 78.4 | 84.8 | 69.8 | 82.5 | 77.0 | 81.4 | 85.3 |
| Ts of glass (° C.) | | 858 | 776 | 775 | — | 846 | 909 | 819 | 792 |
| Blend proportions (vol %) | Glass powder | 100 | 100 | 100 | 100 | 100 | 100 | 100 | 100 |
| | Alumina powder | 0 | 0 | 0 | 0 | 0 | 0 | 0 | 0 |
| Surface roughness Ra (μm) | | 0.010 | 0.004 | — | — | — | — | — | — |
| Reflectance (%) | LTCC substrate Ag co-fired 840° C. | 91.5 | 92.3 | 90.3 | 89.5 | 92.6 | 92.6 | 94.5 | 95.7 |
| | 870° C. | 93.9 | 94.8 | 90.1 | 90.0 | 95.3 | 94.0 | 95.4 | 95.4 |
| | 900° C. | 95.0 | 94.7 | 91.3 | 90.5 | 96.2 | 94.8 | 96.0 | 95.4 |
| | Alumina substrate Ag co-fired 840° C. | 89.4 | 89.9 | 85.6 | 82.6 | 88.9 | 84.1 | 90.7 | 90.6 |
| | 870° C. | 90.5 | 89.2 | 84.3 | 75.0 | 90.5 | 86.2 | 91.5 | 91.3 |
| | 900° C. | 92.1 | 91.8 | 84.5 | 82.3 | 91.5 | 87.9 | 92.4 | 91.9 |
| | Alumina substrate Ag individually fired 840° C. | 90.7 | 90.4 | 69.3 | 62.7 | 79.6 | 84.5 | 91.4 | 92.1 |
| | 870° C. | 91.7 | 91.2 | 80.9 | 72.9 | 86.0 | 83.2 | 91.6 | 92.1 |
| | 900° C. | 92.7 | 91.9 | 82.7 | 77.2 | 91.5 | 87.5 | 92.8 | 92.6 |

TABLE 4

|  |  | Ex. 27 | Ex. 28 | Ex. 29 | Ex. 30 | Ex. 31 | Ex. 32 | Ex. 33 | Ex. 34 | Ex. 35 |
|---|---|---|---|---|---|---|---|---|---|---|
| Glass composition (mol %) | $SiO_2$ | 84.1 | 51.4 | 49.4 | 63.5 | 51.1 | 70.3 | 66.6 | 68.6 | 63.5 |
| | $B_2O_3$ | 14.8 | 8.1 | 21.3 | 14.9 | 16.6 | 0.0 | 6.0 | 3.0 | 8.9 |
| | ZnO | 0.0 | 0.0 | 0.0 | 0.0 | 0.0 | 0.0 | 0.0 | 0.0 | 0.0 |
| | $Al_2O_3$ | 0.0 | 5.5 | 7.3 | 2.7 | 13.0 | 2.6 | 5.7 | 5.6 | 3.9 |
| | MgO | 0.0 | 0.0 | 0.0 | 0.0 | 0.0 | 0.0 | 0.0 | 0.0 | 0.0 |
| | CaO | 0.0 | 35.0 | 22.0 | 14.3 | 16.0 | 18.9 | 14.3 | 14.1 | 17.8 |
| | SrO | 0.0 | 0.0 | 0.0 | 0.0 | 0.0 | 0.0 | 0.0 | 0.0 | 0.0 |
| | BaO | 0.0 | 0.0 | 0.0 | 0.0 | 0.0 | 0.0 | 0.0 | 0.0 | 0.0 |
| | $Li_2O$ | 0.0 | 0.0 | 0.0 | 0.0 | 0.0 | 0.0 | 0.0 | 0.0 | 0.0 |
| | $Na_2O$ | 0.0 | 0.0 | 0.0 | 0.0 | 2.1 | 4.5 | 6.4 | 7.7 | 4.9 |
| | $K_2O$ | 1.2 | 0.0 | 0.0 | 4.6 | 1.1 | 3.7 | 1.0 | 0.9 | 1.0 |
| | $TiO_2$ | 0.0 | 0.0 | 0.0 | 0.0 | 0.0 | 0.0 | 0.0 | 0.0 | 0.0 |
| | $ZrO_2$ | 0.0 | 0.0 | 0.0 | 0.0 | 0.0 | 0.0 | 0.0 | 0.0 | 0.0 |
| | Total | 100.0 | 100.0 | 100.0 | 100.0 | 100.0 | 100.0 | 100.0 | 100.0 | 100.0 |
| | $R_2O - Al_2O_3$ | 1.2 | -5.5 | -7.3 | 1.9 | -9.8 | 5.6 | 1.6 | 3.0 | 1.9 |
| | $R_2O - (Al_2O_3 + B_2O_3)$ | -13.6 | -13.6 | -28.6 | -13.0 | -26.5 | 5.6 | -4.4 | 0.1 | -7.0 |
| | $SiO_2 + 3 \times Al_2O_3$ | 84.1 | 67.9 | 71.2 | 71.7 | 90.3 | 78.0 | 83.8 | 85.5 | 75.3 |
| Ts of glass (° C.) | | 820 | 833 | 784 | 885 | 797 | 823 | 795 | 799 | 799 |
| Blend proportions (vol %) | Glass powder | 100 | 100 | 100 | 100 | 100 | 100 | 100 | 100 | 100 |
| | Alumina powder | 0 | 0 | 0 | 0 | 0 | 0 | 0 | 0 | 0 |
| Surface roughness Ra (μm) | | — | — | — | — | 0.005 | 0.271 | 0.147 | 0.324 | 0.099 |
| Reflectance (%) | LTCC substrate Ag co-fired 840° C. | 91.2 | 88.0 | 93.8 | 92.8 | 91.6 | 38.5 | 75.9 | 43.4 | — |
| | 870° C. | 93.5 | 89.2 | 94.2 | 93.6 | 93.9 | 35.3 | 75.8 | 61.3 | 83.0 |
| | 900° C. | 94.0 | 89.8 | 95.2 | 94.2 | 94.6 | 36.4 | 88.2 | 60.0 | — |
| | Alumina substrate Ag co-fired 840° C. | 83.8 | 67.5 | 89.5 | 83.5 | 90.0 | 51.5 | 71.6 | 68.6 | — |
| | 870° C. | 89.0 | 76.6 | 91.0 | 84.7 | 91.0 | 67.8 | 73.5 | 70.3 | — |
| | 900° C. | 90.6 | 76.6 | 91.3 | 86.2 | 91.1 | 73.8 | 78.5 | 74.4 | — |
| | Alumina substrate Ag individually fired 840° C. | 90.5 | 67.2 | 89.0 | 78.2 | 90.0 | 51.8 | 79.0 | 76.8 | — |
| | 870° C. | 91.1 | 78.2 | 91.0 | 84.6 | 90.8 | 66.0 | 80.8 | 78.8 | — |
| | 900° C. | 92.5 | 82.8 | 92.8 | 86.2 | 91.8 | 79.4 | 82.7 | 81.0 | — |

TABLE 5

|  |  |  | Ex. 36 | Ex. 37 | Ex. 38 | Ex. 39 | Ex. 40 | Ex. 41 | Ex. 42 | Ex. 43 |
|---|---|---|---|---|---|---|---|---|---|---|
| Glass composition (mol %) | $SiO_2$ |  | 60.4 | 60.4 | 47.9 | 46.0 | 41.7 | 58.6 | 43.4 | 60.4 |
|  | $B_2O_3$ |  | 15.6 | 15.6 | 15.6 | 20.6 | 15.6 | 12.1 | 16.7 | 15.6 |
|  | ZnO |  | 0.0 | 0.0 | 0.0 | 0.0 | 0.0 | 0.0 | 0.0 | 0.0 |
|  | $Al_2O_3$ |  | 6.0 | 6.0 | 6.0 | 13.5 | 6.0 | 5.8 | 13.8 | 6.0 |
|  | MgO |  | 0.0 | 0.0 | 0.0 | 0.0 | 0.0 | 0.0 | 0.0 | 0.0 |
|  | CaO |  | 15.0 | 7.5 | 27.5 | 16.5 | 33.7 | 10.3 | 22.8 | 15.0 |
|  | SrO |  | 0.0 | 7.5 | 0.0 | 0.0 | 0.0 | 10.3 | 0.0 | 0.0 |
|  | BaO |  | 0.0 | 0.0 | 0.0 | 0.0 | 0.0 | 0.0 | 0.0 | 0.0 |
|  | $Li_2O$ |  | 0.0 | 0.0 | 0.0 | 0.0 | 0.0 | 0.0 | 0.0 | 0.0 |
|  | $Na_2O$ |  | 2.0 | 2.0 | 2.0 | 2.2 | 2.0 | 1.9 | 2.1 | 2.0 |
|  | $K_2O$ |  | 1.0 | 1.0 | 1.0 | 1.1 | 1.0 | 1.0 | 1.1 | 1.0 |
|  | $TiO_2$ |  | 0.0 | 0.0 | 0.0 | 0.0 | 0.0 | 0.0 | 0.0 | 0.0 |
|  | $ZrO_2$ |  | 0.0 | 0.0 | 0.0 | 0.0 | 0.0 | 0.0 | 0.0 | 0.0 |
|  | Total |  | 100.0 | 100.0 | 100.0 | 100.0 | 100.0 | 100.0 | 100.0 | 100.0 |
|  | $R_2O$—$Al_2O_3$ |  | −3.0 | −3 | −3.0 | −10.2 | −3.0 | −2.9 | −10.6 | −3.0 |
|  | $R_2O$—($Al_2O_3$ + $B_2O_3$) |  | −18.6 | −18.6 | −18.6 | −30.8 | −18.6 | −15.0 | −27.3 | −18.6 |
|  | $SiO_2$ + 3 × $Al_2O_3$ |  | 78.4 | 78.4 | 65.9 | 86.5 | 59.7 | 76.0 | 84.8 | 78.4 |
| Ts of glass (° C.) |  |  | 856 | 803 | 789 | 776 | 763 | 813 | 785 | 856 |
| Blend proportions (vol %) | Glass powder |  | 71 | 70 | 70 | 70 | 70 | 70 | 70 | 70 |
|  | Alumina powder |  | 29 | 30 | 30 | 30 | 30 | 30 | 30 | 30 |
| Surface roughness Ra (μm) |  |  | 0.008 | — | — | — | — | — | — | — |
| Reflectance (%) | LTCC substrate Ag co-fired | 840° C. | — | 91.7 | 93.8 | 90.4 | 88.4 | 93.2 | 91.3 | 92.4 |
|  |  | 870° C. | 92.0 | 91.7 | 93.9 | 91.9 | 87.5 | 94.4 | 92.7 | 92.5 |
|  |  | 900° C. | — | 92.7 | 92.5 | 92.9 | 91.5 | 92.3 | 91.8 | 93.2 |
|  | Alumina substrate Ag co-fired | 840° C. | — | 87.9 | 88.2 | 89.5 | 71.8 | 89.1 | 87.2 | 89.9 |
|  |  | 870° C. | — | 88.1 | 86.7 | 89.6 | 73.6 | 88.0 | 88.3 | 90.8 |
|  |  | 900° C. | — | 90.1 | 88.1 | 80.8 | 77.3 | 90.3 | 88.9 | 92.6 |
|  | Alumina substrate Ag individually fired | 840° C. | — | 89.1 | 84.1 | 91.0 | 61.0 | 90.3 | 89.4 | 90.6 |
|  |  | 870° C. | — | 90.0 | 85.1 | 90.6 | 62.2 | 87.2 | 88.5 | 91.0 |
|  |  | 900° C. | — | 90.0 | 87.7 | 91.7 | 65.6 | 88.3 | 88.2 | 91.2 |

TABLE 6

|  |  |  | Ex. 44 | Ex. 45 | Ex. 46 | Ex. 47 | Ex. 48 | Ex. 49 | Ex. 50 | Ex. 51 |
|---|---|---|---|---|---|---|---|---|---|---|
| Glass composition (mol %) | $SiO_2$ |  | 53.1 | 60.4 | 43.4 | 40.0 | 54.9 | 59.3 | 62.7 | 66.6 |
|  | $B_2O_3$ |  | 15.3 | 15.6 | 13.4 | 14.9 | 15.8 | 15.3 | 16.2 | 16.2 |
|  | ZnO |  | 0.0 | 0.0 | 0.0 | 0.0 | 0.0 | 0.0 | 0.0 | 0.0 |
|  | $Al_2O_3$ |  | 5.9 | 6.0 | 13.8 | 9.9 | 9.2 | 5.9 | 6.2 | 6.2 |
|  | MgO |  | 0.0 | 0.0 | 0.0 | 0.0 | 0.0 | 0.0 | 0.0 | 0.0 |
|  | CaO |  | 10.4 | 7.5 | 22.8 | 32.3 | 15.2 | 14.7 | 7.8 | 3.9 |
|  | SrO |  | 14.3 | 0.0 | 0.0 | 0.0 | 0.0 | 0.0 | 0.0 | 0.0 |
|  | BaO |  | 0.0 | 7.5 | 0.0 | 0.0 | 0.0 | 0.0 | 0.0 | 0.0 |
|  | $Li_2O$ |  | 0.0 | 0.0 | 0.0 | 0.0 | 0.0 | 0.0 | 0.0 | 0.0 |
|  | $Na_2O$ |  | 1.0 | 2.0 | 5.5 | 1.9 | 0.0 | 0.0 | 4.7 | 4.7 |
|  | $K_2O$ |  | 0.0 | 1.0 | 1.1 | 1.0 | 4.9 | 4.8 | 2.3 | 2.3 |
|  | $TiO_2$ |  | 0.0 | 0.0 | 0.0 | 0.0 | 0.0 | 0.0 | 0.0 | 0.0 |
|  | $ZrO_2$ |  | 0.0 | 0.0 | 0.0 | 0.0 | 0.0 | 0.0 | 0.0 | 0.0 |
|  | Total |  | 100.0 | 100.0 | 100.0 | 100.0 | 100.0 | 100.0 | 100.0 | 100.0 |
|  | $R_2O$—$Al_2O_3$ |  | −4.9 | −3.0 | −7.2 | −7.1 | −4.3 | −1.1 | 0.8 | 0.8 |
|  | $R_2O$—($Al_2O_3$ + $B_2O_3$) |  | −20.2 | −18.6 | −20.6 | −22.0 | −20.1 | −16.4 | −15.4 | −15.4 |
|  | $SiO_2$ + 3 × $Al_2O_3$ |  | 70.8 | 78.4 | 84.8 | 69.8 | 82.5 | 77.0 | 81.4 | 85.3 |
| Ts of glass (° C.) |  |  | 858 | 776 | 775 | — | 846 | 909 | 819 | 792 |
| Blend proportions (vol %) | Glass powder |  | 70 | 70 | 70 | 70 | 70 | 70 | 70 | 70 |
|  | Alumina powder |  | 30 | 30 | 30 | 30 | 30 | 30 | 30 | 30 |
| Surface roughness Ra (μm) |  |  | — | — | — | — | — | — | — | — |
| Reflectance (%) | LTCC substrate Ag co-fired | 840° C. | 91.0 | 89.3 | 90.0 | 86.2 | 92.2 | 93.2 | 92.2 | 90.1 |
|  |  | 870° C. | 92.0 | 91.9 | 90.3 | 87.3 | 91.5 | 91.7 | 92.5 | 90.8 |
|  |  | 900° C. | 92.0 | 92.0 | 91.0 | 91.6 | 92.3 | 93.3 | 91.8 | 91.4 |
|  | Alumina substrate Ag co-fired | 840° C. | 87.4 | 86.9 | 84.2 | 68.3 | 88.5 | 87.3 | 88.1 | 89.1 |
|  |  | 870° C. | 88.0 | 87.7 | 84.5 | 75.5 | 89.8 | 90.1 | 90.4 | 89.8 |
|  |  | 900° C. | 89.6 | 88.7 | 84.7 | 78.1 | 90.7 | 90.5 | 90.5 | 91.0 |
|  | Alumina substrate Ag individually fired | 840° C. | 89.6 | 90.2 | 83.7 | 73.2 | 89.6 | 89.7 | 90.9 | 91.1 |
|  |  | 870° C. | 88.0 | 90.0 | 82.4 | 70.8 | 90.7 | 91.3 | 91.2 | 91.3 |
|  |  | 900° C. | 87.8 | 91.1 | 82.0 | 74.7 | 91.2 | 91.7 | 91.4 | 91.3 |

TABLE 7

|  |  | Ex. 52 | Ex. 53 | Ex. 54 | Ex. 55 | Ex. 56 | Ex. 57 | Ex. 58 | Ex. 59 |
|---|---|---|---|---|---|---|---|---|---|
| Glass composition (mol %) | $SiO_2$ | 84.1 | 51.4 | 49.4 | 63.5 | 51.1 | 70.3 | 66.6 | 68.6 |
|  | $B_2O_3$ | 14.8 | 8.1 | 21.3 | 14.9 | 16.6 | 0.0 | 6.0 | 3.0 |
|  | ZnO | 0.0 | 0.0 | 0.0 | 0.0 | 0.0 | 0.0 | 0.0 | 0.0 |
|  | $Al_2O_3$ | 0.0 | 5.5 | 7.3 | 2.7 | 13.0 | 2.6 | 5.7 | 5.6 |
|  | MgO | 0.0 | 0.0 | 0.0 | 0.0 | 0.0 | 0.0 | 0.0 | 0.0 |
|  | CaO | 0.0 | 35.0 | 22.0 | 14.3 | 16.0 | 18.9 | 14.3 | 14.1 |
|  | SrO | 0.0 | 0.0 | 0.0 | 0.0 | 0.0 | 0.0 | 0.0 | 0.0 |
|  | BaO | 0.0 | 0.0 | 0.0 | 0.0 | 0.0 | 0.0 | 0.0 | 0.0 |
|  | $Li_2O$ | 0.0 | 0.0 | 0.0 | 0.0 | 0.0 | 0.0 | 0.0 | 0.0 |
|  | $Na_2O$ | 0.0 | 0.0 | 0.0 | 0.0 | 2.1 | 4.5 | 6.4 | 7.7 |
|  | $K_2O$ | 1.2 | 0.0 | 0.0 | 4.6 | 1.1 | 3.7 | 1.0 | 0.9 |
|  | $TiO_2$ | 0.0 | 0.0 | 0.0 | 0.0 | 0.0 | 0.0 | 0.0 | 0.0 |
|  | $ZrO_2$ | 0.0 | 0.0 | 0.0 | 0.0 | 0.0 | 0.0 | 0.0 | 0.0 |
|  | Total | 100.0 | 100.0 | 100.0 | 100.0 | 100.0 | 100.0 | 100.0 | 100.0 |
|  | $R_2O-Al_2O_3$ | 1.2 | −5.5 | −7.3 | 1.9 | −9.8 | 5.6 | 1.6 | 3.0 |
|  | $R_2O-(Al_2O_3 + B_2O_3)$ | −13.6 | −13.6 | −28.6 | −13.0 | −26.5 | 5.6 | −4.4 | 0.1 |
|  | $SiO_2 + 3 \times Al_2O_3$ | 84.1 | 67.9 | 71.2 | 71.7 | 90.3 | 78.0 | 83.8 | 85.5 |
| Ts of glass (° C.) |  | 820 | 833 | 784 | 885 | 797 | 823 | 795 | 799 |
| Blend proportions (vol %) | Glass powder | 70 | 70 | 70 | 70 | 70 | 70 | 70 | 70 |
|  | Alumina powder | 30 | 30 | 30 | 30 | 30 | 30 | 30 | 30 |
| Surface roughness Ra (μm) |  | — | — | — | — | — | — | — | — |
| Reflectance (%) | LTCC substrate Ag co-fired | 840° C. | 88.2 | 87.6 | 92.2 | 93.5 | 89.4 | 34.2 | 83.0 | 78.1 |
|  |  | 870° C. | 90.5 | 90.1 | 93.5 | 93.5 | 90.9 | 42.0 | 81.1 | 76.6 |
|  |  | 900° C. | 91.1 | 89.2 | 93.6 | 93.5 | 92.4 | 39.5 | 84.3 | 77.6 |
|  | Alumina substrate Ag co-fired | 840° C. | 89.7 | 77.4 | 89.7 | 88.6 | 89.2 | 52.6 | 73.1 | 64.3 |
|  |  | 870° C. | 90.2 | 77.8 | 91.0 | 90.2 | 89.6 | 58.9 | 75.2 | 64.6 |
|  |  | 900° C. | 92.0 | 65.1 | 92.8 | 91.5 | 90.3 | 61.6 | 75.0 | 66.8 |
|  | Alumina substrate Ag individually fired | 840° C. | 90.6 | 77.4 | 89.9 | 84.0 | 91.2 | 52.3 | 80.9 | 68.9 |
|  |  | 870° C. | 91.9 | 81.8 | 91.0 | 90.3 | 90.8 | 57.3 | 80.5 | 67.5 |
|  |  | 900° C. | 91.5 | 69.9 | 91.3 | 91.3 | 91.6 | 65.2 | 81.0 | 68.3 |

With respect to the reflectance of the substrate for mounting a light-emitting element, since the surface of the silver reflection layer having no vitreous insulating layer has a reflectance of 95%, the reflectance is preferably as close as possible thereto. In consideration of the interrelation between the reflectance measured by this method and the results of measuring the quantity of light by actually mounting the light-emitting element on a package, a reflectance of 85% or less as measured in Examples is considered to be not desirable as a vitreous insulating layer, since it is thereby not possible to efficiently reflect light from the light-emitting element.

Industrial Applicability

The substrate for mounting a light-emitting element of the present invention and the light-emitting device employing it are useful, for example, for backlights of e.g. mobile phones or liquid crystal displays.

| MEANING OF SYMBOLS | |
|---|---|
| 1: | Substrate main body |
| 2: | Silver reflection layer |
| 3: | Vitreous insulating layer |
| 4: | Light-emitting element |
| 5: | Connection terminal area |
| 7: | Bonding wire |
| 8: | Phosphor layer |
| 9: | External electrode terminal |
| 10: | Substrate for mounting light-emitting element |
| 11: | Connection via |
| 12: | Thermal via |
| 20: | Light-emitting device |

The entire disclosures of Japanese Patent Application No. 2010-034976 filed on Feb. 19, 2010 and Japanese Patent Application No. 2010-257121 filed on Nov. 17, 2010 including specifications, claims, drawings and summaries are incorporated herein by reference in their entireties.

What is claimed is:

1. A substrate for mounting a light-emitting element, which comprises a substrate main body having a mounting surface on which a light-emitting element can be mounted, a reflection layer formed on a part of the mounting surface of the substrate main body and comprising silver to reflect light emitted from the light-emitting element when mounted, and a vitreous insulating layer formed on the reflection layer, wherein the vitreous insulating layer comprises a glass comprising $SiO_2$, at least one of $Al_2O_3$ and $B_2O_3$, and at least one member selected from $Li_2O$, $Na_2O$ and $K_2O$, wherein ($Li_2O$+ $Na_2O$+$K_2O$)—$Al_2O_3$ is from −20 to 1.5% and $SiO_2$+(3× $Al_2O_3$) is at most 90% calculated using the mol % of each of said $SiO_2$, $Al_2O_3$ $B_2O_3$, $Li_2O$, $Na_2O$ and $K_2O$ in said glass.

2. The substrate for mounting a light-emitting element according to claim 1, wherein the glass comprises, as represented by mol % based on 100 mol %, from 35 to 85% of $SiO_2$, from 0 to 20% of $Al_2O_3$, from 0 to 25% of $B_2O_3$, more than 5 to 40% of at least one member selected from CaO, SrO and BaO, from 0 to 40% of CaO, from 0 to 14% of SrO and from 0 to 7% of BaO, and more than 1 to 7% of at least one member selected from $Li_2O$, $Na_2O$ and $K_2O$.

3. The substrate for mounting a light-emitting element according to claim 1, wherein the glass comprises, as represented by mol % based on 100 mol %, from 35 to 85% of $SiO_2$, more than 5 to 20% of $Al_2O_3$, from 0 to 25% of $B_2O_3$, from 0 to 5% of at least one member selected from CaO, SrO and BaO, and more than 1 to 7% of at least one member selected from $Li_2O$, $Na_2O$ and $K_2O$.

4. The substrate for mounting a light-emitting element according to claim 1, wherein the glass comprises, as represented by mol % based on 100 mol %, from 35 to 70% of $SiO_2$, from 1 to 15% of $Al_2O_3$, from 7 to 25% of $B_2O_3$, from 0 to 30% of at least one member selected from CaO, SrO and BaO, and more than 1 to 7% of at least one member selected from $Li_2O$, $Na_2O$ and $K_2O$.

5. The substrate for mounting a light-emitting element according to claim 1, wherein the vitreous insulating layer further comprises a ceramics filler.

6. The substrate for mounting a light-emitting element according to claim 1, further comprising a connection terminal area for the light-emitting element formed on the substrate main body, and wherein the vitreous insulating layer is formed in a region other than the connection terminal area.

7. The substrate for mounting a light-emitting element according to claim 1, wherein the substrate main body has a concave, and the bottom surface of the concave is the mounting surface on which a light-emitting element can be mounted.

8. A light-emitting device, comprising the substrate for mounting a light-emitting element as defined in claim 1, a light-emitting element mounted on the vitreous insulating layer of the substrate for mounting a light-emitting element, and a phosphor layer covering the light-emitting element.

* * * * *